(12) United States Patent
Yang

(10) Patent No.: US 7,683,107 B2
(45) Date of Patent: *Mar. 23, 2010

(54) INK JET PRINTABLE THICK FILM COMPOSITIONS AND PROCESSES

(75) Inventor: Haixin Yang, Chapel Hill, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 249 days.

This patent is subject to a terminal disclaimer.

(21) Appl. No.: 10/775,848

(22) Filed: Feb. 9, 2004

(65) Prior Publication Data

US 2005/0176849 A1 Aug. 11, 2005

(51) Int. Cl.
C09D 11/10 (2006.01)
C09D 11/00 (2006.01)
C09D 5/24 (2006.01)
C09D 5/00 (2006.01)

(52) U.S. Cl. .................... 523/161; 523/160; 106/31.13; 106/31.32; 106/31.64; 347/100

(58) Field of Classification Search ................ 523/160, 523/161; 106/31.13, 31.32, 31.64; 347/100, 347/105, 106, 107
See application file for complete search history.

(56) References Cited

U.S. PATENT DOCUMENTS

| | | | |
|---|---|---|---|
| 2,760,863 A | 8/1956 | Plambeck, Jr. | |
| 2,850,445 A | 9/1958 | Oster | |
| 2,875,047 A | 2/1959 | Oster | |
| 2,927,022 A | 3/1960 | Martin et al. | |
| 3,074,974 A | 1/1963 | Gebura | |
| 3,097,096 A | 7/1963 | Oster | |
| 3,097,097 A | 7/1963 | Oster | |
| 3,145,104 A | 8/1964 | Oster et al. | |
| 3,380,831 A | 4/1968 | Cohen et al. | |
| 3,427,161 A | 2/1969 | Laridon et al. | |
| 3,479,185 A | 11/1969 | Chambers, Jr. | |
| 3,549,367 A | 12/1970 | Chang et al. | |
| 4,162,162 A | 7/1979 | Dueber | |
| 4,942,056 A * | 7/1990 | Shimura et al. | 427/457 |
| 5,132,248 A | 7/1992 | Drummond et al. | |
| 5,443,628 A * | 8/1995 | Loria et al. | 106/31.65 |
| 5,798,397 A * | 8/1998 | Noguchi et al. | 522/81 |
| 5,837,042 A * | 11/1998 | Lent et al. | 106/31.14 |
| 5,882,722 A | 3/1999 | Kydd | |
| 5,889,083 A * | 3/1999 | Zhu | 523/161 |
| 5,889,084 A * | 3/1999 | Roth | 523/161 |
| 6,017,259 A | 1/2000 | Motoi et al. | |
| 6,153,348 A | 11/2000 | Kydd et al. | |
| 6,251,175 B1 * | 6/2001 | Zhu et al. | 106/31.58 |
| 6,274,412 B1 | 8/2001 | Kydd et al. | |
| 6,379,444 B1 * | 4/2002 | Adkins et al. | 106/31.6 |
| 6,379,745 B1 | 4/2002 | Kydd et al. | |
| 6,555,205 B2 * | 4/2003 | Grant et al. | 101/457 |
| 6,896,937 B2 * | 5/2005 | Woudenberg | 427/511 |
| 7,141,104 B2 * | 11/2006 | De Voeght et al. | 106/31.49 |
| 7,217,344 B2 * | 5/2007 | Sasaki et al. | 204/192.26 |
| 2003/0108664 A1 | 6/2003 | Kodas et al. | |
| 2003/0110978 A1 | 6/2003 | Abe et al. | |
| 2003/0119943 A1 * | 6/2003 | Tucker et al. | 523/160 |
| 2003/0146019 A1 * | 8/2003 | Hirai | 174/257 |
| 2003/0166742 A1 * | 9/2003 | Hirasa et al. | 523/160 |
| 2003/0175411 A1 | 9/2003 | Kodas et al. | |
| 2005/0020730 A1 * | 1/2005 | Valentini et al. | 523/160 |

FOREIGN PATENT DOCUMENTS

| | | |
|---|---|---|
| DE | 198 46 096 A1 | 4/2000 |
| EP | 0 989 570 A1 | 3/2000 |
| EP | 1223201 A2 * | 7/2002 |
| JP | 2000-327964 A | 11/2000 |
| JP | 2002-134878 | 5/2002 |

OTHER PUBLICATIONS

Erez Bruan, Yoav Eichen, Uri Sivan & Gdalyahu Ben-Yoseph, DNA-templated assembly and electrode attachment of a conducting silver wire, Nature, vol. 391, Feb. 19, 1998, pp. 775-778.
Toshihiko Oguchi, Keiki Sugnami, Taizo Nanke, and Toshikatu Kobayashi, Formation of Precise Electrically-Conductive Pattern Using Metal Colloid I-J Ink, IS&Ts NIP 19: 2003 International Conference on Digital Printing Technologies, pp. 656-659.
R.W. West, E.P. Tweedell, and R.C. Buchanan, Ink Jet Printing of Hybrid Circuits, Int. J. Hybrid Microelectron., vol. 6, 1983, pp. 261-267.
K.F. Teng, Member, IEE, and Robert W. Vest, Metallization of Solar Cells with Ink Jet Printing and Silver Metall-Organic Inks, IEEE Translations on Components, Hybrids, and Manufacturing Technology, vol. 11, No. 3, Sep. 1988, pp. 291-297.
Keiicki Nakao (Matsushita Electroni Industial Co., Ltd), Conductor Links for Printing Electrodes of Electronic Devices, Ink-Jet Printing Apparatus, and Cleaning Solvents Therefor, Jpn. Kokai Tokkyo Koho (2000), JP 2000327964A.

* cited by examiner

*Primary Examiner*—Sanza L McClendon

(57) ABSTRACT

The present invention provides a method for the deposition of an ink jet printable composition, to a substrate comprising: depositing an ink composition on a substrate by ink jet printing; wherein said composition comprises: (a) functional material; (b) organic polymer comprising polyvinylpyrrolidone; dispersed in (c) dispersion vehicle selected from organic solvent, water, or mixtures thereof; and wherein the viscosity of said composition is between 5 mPa·s to 50 mPa·s at a temperature of 25 to 35° C.

13 Claims, No Drawings

INK JET PRINTABLE THICK FILM COMPOSITIONS AND PROCESSES

FIELD OF THE INVENTION

This invention relates to electronic circuits. Specifically, this invention relates to materials and deposition processes used to ink jet print ink compositions onto various substrates.

BACKGROUND OF THE INVENTION

Typically, the technologies used to produce electronic circuits and electrode parts in particular have been pattern-screen printing, photo-patterning, or etching copper conductor foils via a photo-resist marking process. Among the three processing methods, only the screen printing process is an additive process. However, it is not digitally controlled. Since the trend in the electronics industry is to make smaller and cheaper electronic devices which require higher resolution and finer conductor lines for performance, it has become necessary to develop conductor materials and processes to achieve these goals.

The use of ink jet printing of conductive materials to substrates for electronic circuit production is both a digital and additive process which provides a less expensive, faster, more environmentally conscious and more flexible method of electronic circuit production. Piezo ink jet technology is the current focus because of its Drop-On-Demand capability.

Typically, piezo ink jet technology can only print liquids with a viscosity of under 20 m·Pas·s measured at the moment of jetting. Such a low viscosity makes it difficult to make a stable, high density dispersion, such as a dispersion containing conventional-size silver particles. This is especially true when the metal particles are larger than a few hundred nanometers in diameter. Another difficulty when a conductor composition has low visicosity and contains a low content of conductor materials is to obtain narrow-in-width yet still thickly printed conductor lines. Thus, the resulting ink jet-printed, thin conductor lines on a plain substrate surface tend to have low conductivity. Nanometer-sized (or nano-size) and colloidal conductor particles may help increase the loading of conductor materials in a stable, low viscosity ink composition. This in turn helps to produce thick ink jet printed conductor lines. However, conductor lines of the prior art made of nano-size particles tend to disconnect or break down during the high temperature firing that is necessary for many ceramic substrate-based applications.

U.S. Pat. No. 5,132,248 to Drummond et al., discloses a process for forming a pattern on a substrate by deposition of a material, consisting of: (a) depositing a suspension of colloidal particles of the material in a solvent on to a substrate by ink jet printing; (b) evaporating the solvent, the material remaining on the substrate; (c) laser annealing the deposited material to the substrate, the pattern being defined by the path of the laser beam; and (d) removing excess material not annealed by the laser beam.

EP 0 989 570 A1 to Nakao et al., teaches an ink or an electronic component comprising water or organic solvent, and a resin dispersed in said water or organic solvent, by 1 wt. % or more to 80 wt. % or less, at viscosity of 2 mPas·s or less. EP 0 989 570 A1 further teaches a method for manufacturing an electronic component comprising the steps of: repeating a plurality of times a process of forming a specified ink pattern on a ceramic green sheet by an ink jet method using an ink prepared by dispersing metal powder with particle size of 0.001 μm or more to 10 μm or less, in at least water or organic solvent, by 1 wt. % or more to 80 wt. % or less, at viscosity of 2 poise or less; laminating a plurality of the ceramic green sheets forming this ink pattern to form a raw laminated body of ceramic; cutting to specified shape and baking, and forming an external electrode.

JP Kokai Patent Application No. P2000-327964A to Nakao teaches an electronic part electrode ink having a viscosity of 2 P or below, formed by dispersing metal powder of particle diameter 10 μm or less in water or organic solvent at a concentration of 1-80 wt. %, and having a precipitation of 10 mm or less in 10 min or 20 mm or less in 100 min.

The present inventor desired compositions that can be applied by ink jet printing technology onto various substrates while at the same time these compositions are characterized as stable dispersions that contains a large amount of solids (for example, silver metal powder) with a viscosity less than 20 m·Pas·s at the moment of jetting.

SUMMARY OF THE INVENTION

The present invention provides a method for the deposition of an ink jet printable composition, to a substrate comprising:

depositing an ink composition on a substrate by ink jet printing; wherein said composition comprises: (a) functional material; (b) organic polymer comprising polyvinylpyrrolidone; dispersed in (c) dispersion vehicle selected from organic solvent, water, or mixtures thereof; and wherein the viscosity of said composition is between 5 mPa·s to 50 mPa·s at a temperature of 25 to 35° C.

DETAILED DESCRIPTION OF THE INVENTION

The present invention addresses the use of a polyvinylpyrrolidone homopolymer and/or its copolymers in the formulation of ink composition(s) that may be applied by various technologies, including ink jet printing technologies. In one embodiment, the composition(s) are applied by piezo ink jet technology.

Furthermore, the present invention provides stable ink composition(s) that have a viscosity of less than 20 mPas·s at room temperature, contains a high content of solids (electrically functional materials), such as silver particles, as large as 1.2 microns in diameter, and can be printed to form an electronic circuit by a piezo ink jet process. Additionally, an object of the present invention is to maintain this low viscosity and high loading while using solid particles that are larger than nano-size. In particular, it is an object to maintain the low viscosity and high loading with solid particles that are larger than a few hundreds of nanometers while providing a stable dispersion.

A further object of the invention is to provide an ink jet printable composition which remains stable for up to about 24 hours and may be restabilized by shaking. Still a further objective of the present invention is to provide a method for the deposition of these composition(s) utilizing ink jet printing technology.

The present invention further provides a process/method that allows for thicker ink depth yet more narrow lines of ink compositions to be deposited, so that high conductivity may be obtained. Additionally, the ink jet printed conductor lines can withstand high temperature firing. This process of ink deposition is performed by ink jet technology, including but not limited to piezo ink jet technology. The dispersion stability of the compositions of the present invention allows the compositions to be printed without requiring continuous agitation of the ink. The functional materials are comprised of mixtures of metal powders, metal powders and metal resinates, or mixtures of metal powders and frit resinates.

The term functional material as used herein means materials that impart appropriate electrically functional properties, such as conductive, resistive and dielectric properties. Thus, more specifically functional material may be conductive functional material, dielectric functional material, and resistive functional material.

The main components of the altered thick film composition (herein termed ink composition) of the present invention will be discussed herein below.

I. Inorganic Materials

A. Functional Materials

Examples of dielectric functional materials include Barium Titanate and Titanium Dioxide, resistive materials; phosphors, and/or pigments.

Resistor functional material includes conductive oxide(s). These functional materials may be utilized in the present invention. Examples of the functional material in resistor compositions are Pd/Ag and $RuO_2$.

Additional dielectric functional materials include glass or ceramic, ceramic powders, oxide and non-oxide frits, crystallization initiator or inhibitor, surfactants, colorants, organic mediums, and other components common in the art of such thick film dielectric compositions.

The electrical functionality of the finely divided functional materials does not itself affect the ability of the invention to overcome problems associated with printability.

To illustrate a conductive circuit element of the present invention, conductor functional material include mixtures of metal powders, metal powders and metal resinates, or mixtures of metal powders and frit resinates.

Examples of conductive functional materials, used typically in a powder form such as: gold, silver, copper, nickel, aluminum, platinum, palladium, molybdenum, tungsten, tantalum, tin, indium, lanthanum, gadolinium, ruthenium, cobalt, titanium, yttrium, europium, gallium, zinc, magnesium, barium, cerium, strontium, lead, antimony, and combinations thereof and others common in the art of conductor compositions.

Furthermore, a fatty acid surfactant may be used to coat the functional material, although not required. The purpose of the fatty acid surfactant is to prevent the powders from clumping together. The coated functional particles (functional material) may be completely or partially coated with a surfactant. The surfactant is selected from stearic acid, palmitic acid, a salt of stearate, a salt of palmitate and mixtures thereof. The counterion can be, but is not limited to, hydrogen, ammonium, sodium, potassium and mixtures thereof.

If a mixture of stearate and palmitate or salts thereof are used, it is preferred to be within the ratio of 30/70 to 70/30 and all ratios contained therein. The surfactant is found in the composition within the range of 0.10-1 wt. % based on the weight of the functional particles (functional material) whether found on the functional particles (functional material) or added to the composition.

The functional particles (functional materials) may be coated by mixing the particles with a solvent and an appropriate amount of the surfactant. Examples of some suitable solvents include: water, alcohols, texanol, terpineol, glycols and any other solvents known in the art. The solvent should offer the surfactant enough solubility to affect the coating process. For Example, a well dispersed slurry of non-dried silver in water. Other embodiments use organic solvents and/or dry silver powder. The mixing process can be achieved by any means for mixing but usually such apparatus as stirring vessels with rotating impellers, ball mills, stirred media mills, vibratory mills, and ultrasonic dispersors are employed.

The particle size distribution of the functional particles (functional materials) should not exceed that which would render it ineffective with respect to ink jet technology. However, practically, it is preferred that the particle size ($D_{50}$) of the particles be in the range of 0.005 to 2 microns. In one embodiment the particle size is 0.1 to 1.2 microns. In yet another embodiment, the particle size range is 0.3 to 0.8 microns. $D_{100}$ should not be larger than 5 microns.

B. Polymers

The organic polymers are important to the compositions of this invention. One of the most important requirements for an organic polymer is its ability to disperse functional materials, for example metal powders, in the composition. This invention discloses the discovery that polyvinylpyrrolidone homopolymer and its copolymers are a most effective organic polymer for dispersing functional materials, especially metals, particularly silver metals in the compositions. Polyvinylpyrrolidone, copolymers of vinylpyrrolidone with other monomers, or mixtures thereof may be used independently or in conjunction with other polymers, such as polymethacylates and polyacrylates.

Polyvinylpyrrolidone copolymers can be a copolymer of vinylpyrrolidone with any other monomer(s). Two embodiments of copolymers are poly(vinylpyrrolidone-co-vinyl alcohol) and poly(vinylpyrrolidone-co-methacrylate). The amount of vinylpyrrolidone in a copolymer can range from 5% to 100% by weight. The weight average molecular weight, Mw, of polyvinylpyrrolidone or polyvinylpyrrolidone copolymer can be from 1,000 to 1,000,000. In one embodiment, the Mw range is 2,000 to 20,000. In a further embodiment, the Mw range is 5,000 to 10,000.

The concentration of the functional materials in the ink composition is critical to the electrical performance and the viscosity of the ink. The recommended concentrations of functional material in composition are the range of from 1 to 60 wt. % based on total composition weight. Suitable concentrations may include those that are less than or greater than the 1% and 60% limit since suitable concentrations are those that provide adequate electrical properties and viscosity for application. Functional materials are selected to result in compositions having the electrical properties of conductivity, resistivity and diaelectric properties. The value ranges of such electrical properties may be achieved by mixing functional materials with other functional or inert materials.

C. Inorganic Binders

The electrically functional materials described herein above are finely dispersed in an organic medium and are accompanied by inorganic binders and are optionally accompanied by inorganic resinates, metal oxides, ceramics, and fillers, such as other powders or solids. The function of an inorganic binder in a composition is to bind the sintered particles to the substrate after firing. Examples of inorganic binders include, glass binders (frits), frit resinates (organometalic compounds that decompose during firing to form glass frints), metal oxides and ceramics. Glass frit compositions are those conventionally used in thick film pastes, but further finely grounded. The desired glass transition temperature is in the range of 325 to 600° C.

II. Organic Medium

The main purpose of the organic medium is to serve as a vehicle for dispersion of the finely divided solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion. The organic medium comprises a dispersion vehicle which can be organic solvent-based or aqueous-based.

D. Solvents

The solvent component of the organic medium, which may be water, a mixture of water and organic solvent(s), a single organic solvent or a mixture of organic solvents, is chosen so as to obtain complete solution therein of the polymer and other organic components. The solvent should be inert (non-reactive) towards the other constituents of the conductor composition. The preferred solvents for use in the conductor compositions should have boiling points at atmospheric pressure of less than 300° C., preferably less than 200° C. and most preferably less than 150° C. Such solvents include aliphatic alcohols, such as isopropanol, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents.

E. UV-Curable/Thermal Curable Monomer

Conventional UV-curable methacrylate monomers may be used in the invention. Most of conventional UV-curable monomers are also thermal curable. Monomer components are present in amounts of 1-10 wt. %, based on the total weight of conductor composition. Such preferred monomers include triethylolpropane ethoxy triacrylate, t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethyacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxy-phenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl)ether of bisphenol-A, di-(2-acryloxyethyl) ether of bisphenol-A, di-(3-methacrloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a weight average molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of free radical polymerizable ethylenic linkages particularly when present as terminal linkages. Particularly preferred monomers are polyoxyethylated trimethylolpropane triacrylate, ethylated pentaerythritol triacrylate, dipentaerythritol monohydroxypentaacrylate and 1,10-decanediol dimethlacrylate.

F. Photoinitiators

Photoinitiators are those which generate free radicals upon exposure to actinic light at ambient temperature. Many photoinitiators also decompose upon heating to generate free radicals that, in turn initiate curing of the monomers. Initiators include, but are not limited to, the substituted or unsubstituted polynuclear quinones which are compounds having two intracyclic carbon atoms in a conjugated carbocyclic ring system, e.g., 2-benzyl-2-(dimethylamino)-1-(4-morpholinophenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthracene-5,12-dione, and 1,2,3,4-tetra-hydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; $\alpha$-hydrocarbon-substituted aromatic acyloins, including $\alpha$-methylbenzoin, $\alpha$-allylbenzoin and $\alpha$-phenylbenzoin, thioxanthone and/or thioxanthone derivatives and the appropriate hydrogen donors. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in 0.05 to 5% by weight based on the total weight of the ink.

G. Other Additives

Frequently the organic medium will also contain one or more additives. Additional components may be present in the composition including dispersants, stabilizers, release agents, dispersing agents, stripping agents, antifoaming agents and wetting agents. A few percent of high boiling point solvent may also be used to prevent drying up at the tip of ink jet printer nozzles when a low boiling point solvent is used for the conductor composition.

General Ink Composition Preparation

The ink composition is formulated to have an appropriate consistency for ink jet application. The composition is prepared by mixing the organic polymer, solvent or water, and other organic components in a mixing vessel. The mixture is stirred until all components are dissolved. The viscosity at this point can be adjusted. The inorganic materials are then added to the organic medium. The total composition is then mixed until the inorganic powders are wetted by the organic medium. The mixture is generally dispersed via ultrasound. However, other dispersion technologies, such as micro fluidizer, ball milling may be employed. The viscosity at this point could be adjusted with the appropriate to achieve a viscosity optimum for ink jet processing. The ink composition viscosity may range from 5 mPa·s to 50 mPa·s at a temperature of about 25 to about 35° C. The composition of the present invention has such good dispersion properties that the electrically functional particles (functional materials) in the composition do not readily settle down and allow for stable ink jet printing without on-going agitation of the composition.

Application of Ink Composition to Substrate

The ink composition is typically filtered through a 5-micron filter right before being printed or placed in an application package for printing. An application package comprises a cartridge and the composition(s) of the present invention, wherein said cartridge is suitable for the dispersion of the composition(s) via an ink jet system (ink jet printer). The cartridge is used to hold the ink. Typically, a cartridge will comprise a release or vent, to release the ink composition, and an electrical connection to allow control of the ink composition release. In some instances, the cartridge may also contain the print head itself. The print head contains a series of nozzles which are used to spray/print drops of ink, such as the ink composition(s) of the present invention. The operation of a piezo-type ink jet printer is known.

The substrate includes glass, ceramic or plastic. The compositions of the present invention may be ink jet printed in various patterns, including patterned lines as well as via fills. The substrate surface does not need any special treatment. However, a specially treated surface to change surface tension may result in narrower width and thicker printed lines, as described in Examples 4 and 5. When a glass substrate was treated by washing it with the floro-surfactant, Zonyl FSP, (see Glossary of Materials for description) the resulting printed conductor lines are narrower in width yet thicker. The surface tension range for the treated substrate is typically between 15-100 dyn·cm. For the conductor ink composition of the present invention, one embodiment has a surface tension range between 25 and 60 dyn·cm.

Another way to treat the substrate surface is to ink jet print a surfactant in the desired conductor pattern on a substrate and immediately dry it with heat. Then conductor ink composition is applied on top of the surfactant pattern, as described in Example 5.

UV/Thermal Curing

Modifying substrate surface tension is one way to get narrower and thicker printed conductor lines. Another way is to make conductor ink compositions UV-curable or thermally curable.

In the case of UV-curable ink compositions, UV-light is directed to the substrate where the ink will be printed. After the UV-curable ink leaves the ink jet printer nozzle, ink drops are exposed to intensive UV-light that causes the ink to become partially crosslinked. Therefore, the ink viscosity increases resulting in less spreading of the ink when ink drops reach the substrate, as in Example 6.

In the case of thermal curing, a glass substrate was preheated to 150° C. When the conductor ink drops hit the substrate surface, they become cured or cross-linked, resulting in a viscosity increase. Therefore, there is less spread of ink on substrate surface. The loss of solvent upon hitting the hot substrate may be another mechanism for increased viscosity of the ink. This is dependent on factors, such as the boiling point of the solvent.

General Firing Profile

The composition of the present invention may be processed by using a firing profile. Firing profiles are well known to those skilled in the art of thick film pastes and inks. Removal of the organic medium or water medium and sintering of the inorganic materials is dependent on the firing profile. The profile will determine if the medium is substantially removed from the finished article and if the inorganic materials are substantially sintered in the finished article. The term "substantially" as used herein means at least 95% removal of the medium and sintering the inorganic materials to a point to provide at least adequate resistivity or conductivity or dielectric properties for the intended use or application.

Test Procedures

Fired Sample Thickness

Printed and dried samples were fired using a 3-hour heating profile with a 10 min. peak at 580° C. The thickness was measured at four different points using a contact profilometer. A fired line thickness of 2 microns was obtained by one-pass prining. Conductor lines are still intact after firing. There is not any resistance increase after annealing at 580° C. for 18 hours.

Resistance Measurement

Resistance was measured by a four-point contact conductivity meter.

EXAMPLES

Glossary of Materials

I. Inorganic Materials
  Silver powders—spherical coated or non-coated silver powders manufactured by DuPont ($D_{50}$=1.2 microns).
  Colloidal Silica—Ludox®-am purchased from W. R. Grace.
  Frit resinates—Magnesium TEN-CEM 40745, Lead TEN-CEM 38514, Calcium TEN-CEM 49649 and Bismuth TEN-CEM 25382, purchased from OMG Americas.
  Silver resinate—Silver neodecanoate #1108, purchased from OMG Americas.

II. Polymers
  Poly(vinylpyrrolidone-co-vinylacetate)—PVP/PVA S-630, a co polymer of 60% vinlypyrrolidone and 40% vinylacetate, K-value=30-50, purchased from ISP Technologies.
  Polyvinylpyrrolidone—PVP K-90, purchased from ISP Technologies.
  Poly(methacrylate-co-methacrylic acid), a copolymer of 80% methacrylate and 20% acrylic acid, Mw=6000-9000, Purchased from Noveon.

III. Monomer
  SR454 (Triethylolpropane ethoxy triacrylate), purchased from Sartomer.

IV. Photoinitiator
  Irgacure® 369, 2-benzyl-2-(dimethylamino)-1-(4-morpholinophenyl)-1-butanone, purchased from Ciba Specialty Chemicals.

V. Surfactant for Substrate Surface Treatment
  Zonyl® FSP, a floro-containing surfactant from DuPont.

VI. Organic Solvent
  2-Propanol and ethylene glycol, purchased from Aldrich Chemical.

Example 1

7 g Poly(vinylpyrrolidone-co-vinylacetate) was dissolved in a solvent mixture of 67 g 2-propanol and 1 g ethylene glycol. Then 30 g spherical silver powder ($D_{50}$=1.2 microns) coated with fatty acid was added into the polymer solution. Then following liquid metal resinates were added: 0.3 g Ludox®-am, 1.2 g lead resinate 49044, 0.3 g calcium resinate 49649, 0.25 g bismuth resinate and 0.15 g magnesium resinate.

The mixture was dispersed by ultrasound and filtered through a 5-micron filter. Viscosity of the dispersion is 18 mPas·s at 25° C. The dispersion was deposited onto a clean glass substrate by a piezo ink jet printer. The nozzle orifice is about 70 microns. The printed silver conductor lines were dried and fired at 580° C. The fired line width and thickness are 165 microns and 1.8 microns, respectively. The resistivity of the fired line was 11.5 mohm/square at 5 micron thickness. A ceramic substrate was also used to generate similar results.

The dispersion was stable for up to 24 hours without noticeable silver particle settlement and could still be jetted. After about 24 hours, a stable and jettable dispersion can be re-obtained by simply shaking the mixture by hand.

Example 2

5 g Polyvinylpyrrolidone (PVP K-90) was dissolved in a mixture of 54 g 2-propanol and 1 g ethylene glycol. Then 10 g silver resinate and 30 g spherical silver powder ($D_{50}$=1.2 microns) coated with fatty acid was added into the polymer solution. The mixture was dispersed by ultrasound and filtered through a 5-micon filter. The dispersion was stable and could well be jetted by a piezo ink jet printer.

The dispersion was stable for up to 24 hours without noticeable silver particle settlement and could still be jetted. After about 24 hours, a stable and jettable dispersion can be re-obtained by simply shaking the mixture by hand.

Example 3

5 g Poly(vinylpyrrolidone-co-vinylacetate), (PVP S-630) was dissolved in a mixture of 64 g 2-propanol and 1 g ethylene glycol. Then 30 g spherical silver powder ($D_{50}$=1.2 microns) coated with fatty acid was added into the polymer solution. The mixture was dispersed by ultrasound and filtered through a 5-micon filter. The dispersion was stable and could well be jetted by a piezo ink jet printer.

The dispersion was stable for up to 24 hours without noticeable silver particle settlement and could still be jetted. After about 24 hours, a stable and jettable dispersion can be re-obtained by simply shaking the mixture by hand.

Example 4

A same glass substrate used in Example 1 was washed by Zonyl FSP from DuPont and air-dried at room temperature. Then the same silver dispersion, as in Example 1 was printed onto the Zonyl-treated substrate by the same piezo ink jet printer. The fired line width was 100 microns. The fired thickness was 2.0 micron.

Example 5

The Zonyl FSP was ink jet printed onto a same glass substrate, as in Example 1. Then silver dispersion was ink jet printed on top of the Zonyl lines. The resulting fired silver line width was 110 microns.

Example 6

5 g Poly(vinylpyrrolidone-co-vinylacetate) (PVP S-630) was dissolved in a solvent mixture of 53 g 2-propanol from Aldrich and 1 g ethylene glycol from Aldrich. Then 30 g spherical silver powder ($D_{50}$=1.2 microns) coated with fatty acid was added into the polymer solution. Then following liquid metal resinates were added: 0.3 g Ludox®-am, 1.2 g lead resinate 49044, 0.3 g calcium resinate 49649, 0.25 g bismuth resinate and 0.15 g magnesium resinate, all from OMG Americas, Inc.

The mixture was dispersed by ultrasound. Then 3.5 g SR454 curable monomer and 0.5 g Irgacure369 were added, stirred and filtered through a 5-micron filter. Viscosity of the dispersion is less than 20 mPas·s at 25° C.

The dispersion above was deposited onto a clean glass substrate by a piezo ink jet printer with UV-light focused on the same spots where the ink hit. The ink was hardened as it reached the substrate upon UV-curing, resulting in narrower printed conductor lines than in Example 1.

Example 7

5 g Poly(vinylpyrrolidone-co-vinylacetate) (PVP S-630) was dissolved in a solvent mixture of 59 g 2-isopropanol and 1 g ethylene glycol. Then 30 g spherical silver powder ($D_{50}$=1.2 microns) coated with fatty acid was added into the polymer solution. Then following liquid metal resinates were added: 0.3 g Ludox®-am, 1.2 g lead resinate 49044, 0.3 g calcium resinate 49649, 0.25 g bismuth resinate and 0.15 g magnesium resinate, all from OMG Americas, Inc.

The mixture was dispersed by ultrasound. Then 3.5 g SR454 monomer and 0.5 g Irgacure369 were added, stirred and filtered through a 5-micron filter. Viscosity of the dispersion is less than 20 mPas·s at 25° C. The dispersion was ink jet deposited onto a clean glass substrate that was pre-heated to 150° C. The dispersion hardened because of thermal curing of the methacrylate monomer in the dispersion, resulting in narrower conductor lines than in Example 1. This can be up to 30% narrower than the conductor lines of Example 1.

Example 8

0.32 g Polyvinylpyrrolidone (PVP K-90) was dissolved in 7.68 g water. Then 2.0 g spherical silver powder ($D_{50}$=1.2 microns) coated with fatty acid was added into the polymer solution. The mixture was dispersed by ultrasound and filtered through a 5-micon filter. If necessary, 0.01 g triethylamine was added to reduce foaming before filtration. The dispersion was stable and could be ink jet printed well by a piezo ink jet printer.

The dispersion was stable for up to 24 hours without noticeable silver particle settlement and could still be jetted. After about 24 hours, a stable and jettable dispersion can be re-obtained by simply shaking of the mixture manually.

Example 9

2 g Polyvinylpyrrolidone (PVP K-90) and 2 g poly(methyl methacrylate) were dissolved in a mixture of 54 g 2-propanol and 1 g ethylene glycol. Then 10 g silver resinate and 30 g spherical silver powder (D50=1.2 microns) coated with fatty acid was added into the polymer solution. The mixture was dispersed by ultrasound and filtered through a 5-micon filter. The dispersion was stable and could well be jetted by a piezo ink jet printer.

The dispersion was stable for up to 24 hours without noticeable silver particle settlement and could still be jetted. After about 24 hours, a stable and jettable dispersion can be re-obtained by simply shaking of the mixture manually.

What is claimed is:

1. A method for the deposition of an ink jet printable composition, to a substrate comprising: depositing an ink composition on a substrate by ink jet printing;
   wherein said composition comprises:
   (a) conductive functional material;
   (b) organic polymer comprising polyvinylpyrrolidone; wherein said organic polymer is present in the range of 1-10 wt. %, based on total composition dispersed in
   (c) dispersion vehicle selected from organic solvent, water, or mixtures thereof and wherein the viscosity of said composition is between 5 mPa·s to 50 mPa·s at a temperature of 25 to 35° C. wherein the conductive functional material has an average particle size (D50) of 0.1 to 1.2 microns, wherein the D100 is not larger than 5 micron; and wherein said composition maintains stability for 24 hours;
   (d) firing said ink jet printable composition and substrate wherein said composition further comprises a monomer, wherein said monomer is ultraviolet curable or thermally curable and wherein said composition further comprises inorganic resinate.

2. The method of claim 1 wherein said substrate is treated to change its surface tension.

3. The method of claim 1 wherein said substrate is selected from the group consisting of glass, ceramic, and plastic.

4. The method of claim 1 wherein said inorganic resinate is silver resinate or a mixture of metal resinates.

5. The method of claim 1 wherein said composition is comprised of other polymers selected from the group consisting of polymethacrylates and polyacrylates.

6. The composition of claim 1 wherein said monomer is selected from the group consisting of triethylolpropane ethoxy triacrylate, trimethylolpropane triacrylate, pentaerythritol triacrylate, pentaaerythritol trimethacrylate, trimethylolpropane trimethyacrylate, pentaerythritol tetraacrylate, pentaerythritol tetramethacrylate, triethylene glycol diacrylate, triethylene glycol dimethacrylate, polyoxyethylated trimethylolpropane triacrylate, ethylated pentaerythritol triacrylate, dipentaerythritol monohydroxypentaacrylate and 1,10-decanediol dimethlacrylate.

7. The method of claim 1 wherein said conductive functional material is present in the range of 1-60 wt. %, based on total composition.

8. The method of claim 1 wherein said dispersion vehicle is present in the range of 40-95 wt. %, based on total composition.

9. The method of claim 1 further comprising a photoinitiator.

10. The method of claim 1 wherein said organic solvent is selected from the group consisting of aliphatic alcohols, esters of aliphatic alcohols, terpenes, ethylene glycol, esters of ethylene glycol, carbitol esters and mixtures thereof.

11. The method of claim 7 wherein the conductive functional material is present in amounts of 15%-60%.

12. A method for the deposition of an ink jet printable composition, to a substrate comprising: depositing an ink composition on a substrate by ink jet printing;
   wherein said composition comprises:
   (a) conductive functional material;
   (b) organic polymer comprising polyvinylpyrrolidone; wherein said organic polymer is present in the range of 1-10 wt. %, based on total composition dispersed in
   (c) dispersion vehicle selected from organic solvent, water, or mixtures thereof; and wherein the viscosity of said composition is between 5 mPa·s to 50 mPa·s at a temperature of 25 to 35° C. wherein the conductive functional material has an average particle size (D50) of 0.1 to 1.2 microns, wherein the D100 is not larger than 5 micron; and wherein said composition maintains stability for 24 hours;
   (d) firing said ink jet printable composition and substrate wherein said composition further comprises a monomer, wherein said monomer is ultraviolet curable or thermally curable wherein the conductive functional material is selected from the group consisting of gold, silver, copper, nickel, aluminum, platinum, palladium, molybdenum, tungsten, tantalum, tin, inum, tungsten, tantalum, tin, indium, lanthanum, gadolinium, ruthenium, cobalt, titanium, yttrium, europium, gallium, zinc, magnesium, barium, cerium, strontium, lead, antimony, and combinations thereof.

13. A method for the deposition of an ink jet printable composition, to a substrate comprising: depositing an ink composition on a substrate by ink jet printing;
   wherein said composition comprises:
   (a) conductive functional material wherein said conductive functional material is present in the range of 1-60 wt. %, based on total composition and wherein the conductive functional material is selected from the group consisting of gold, silver, copper, nickel, aluminum, platinum, palladium, molybdenum, tungsten, tantalum, tin, mum, tungsten, tantalum, tin, indium, lanthanum, gadolinium, ruthenium, cobalt, titanium, yttrium, europium, gallium, zinc, magnesium, barium, cerium, strontium, lead, antimony, and combinations thereof;
   (b) organic polymer comprising polyvinylpyrrolidone wherein said organic polymer is present in the range of 1-10 wt. %, based on total composition; dispersed in
   (c) dispersion vehicle selected from organic solvent, water, or mixtures thereof; and wherein the viscosity of said composition is between 5 mPa·s to 50 mPa·s at a temperature of 25 to 35° C. wherein the conductive functional material has an average particle size (D50) of 0.1 to 1.2 microns, wherein the D100 is not larger than 5 micron; and wherein said composition maintains stability for 24 hours;
   (d) firing said ink jet printable composition and substrate wherein said composition further comprises a monomer, wherein said monomer is ultraviolet curable or thermally curable;
   (e) wherein the substrate is treated to change its surface tension prior to depositing the ink composition; and
   (f) wherein the substrate is selected from the group consisting of glass, ceramic, and plastic.

* * * * *

UNITED STATES PATENT AND TRADEMARK OFFICE
CERTIFICATE OF CORRECTION

| | |
|---|---|
| PATENT NO. | : 7,683,107 B2 |
| APPLICATION NO. | : 10/775848 |
| DATED | : March 23, 2010 |
| INVENTOR(S) | : Haixin Yang |

It is certified that error appears in the above-identified patent and that said Letters Patent is hereby corrected as shown below:

Column 11, Line 32: "The composition of claim 1" should read -- The method of claim 1 --

Signed and Sealed this
Fourth Day of January, 2011

David J. Kappos
*Director of the United States Patent and Trademark Office*